(12) United States Patent
Kim

(10) Patent No.: US 7,512,002 B2
(45) Date of Patent: Mar. 31, 2009

(54) NON-VOLATILE MEMORY DEVICE AND PROGRAMMING, READING AND ERASING METHODS THEREOF

(75) Inventor: Ho-jung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 107 days.

(21) Appl. No.: 11/606,246

(22) Filed: Nov. 30, 2006

(65) Prior Publication Data

US 2008/0112227 A1    May 15, 2008

(30) Foreign Application Priority Data

Oct. 31, 2006  (KR) ............... 10-2006-0106716

(51) Int. Cl.
*G11C 16/04* (2006.01)
(52) U.S. Cl. ............... 365/185.11; 365/185.17; 365/185.23
(58) Field of Classification Search ............ 365/185.11, 365/185.17, 185.23
See application file for complete search history.

(56) References Cited

U.S. PATENT DOCUMENTS

| | | | |
|---|---|---|---|
| 5,696,717 A | | 12/1997 | Koh |
| 5,963,475 A | | 10/1999 | Choi et al. |
| 6,125,052 A | | 9/2000 | Tanaka |
| 6,236,594 B1 | * | 5/2001 | Kwon ............... 365/185.11 |
| 6,337,807 B2 | * | 1/2002 | Futatsuyama et al. .. 365/185.17 |
| 6,370,062 B2 | * | 4/2002 | Choi ............... 365/185.17 |
| 6,487,117 B1 | | 11/2002 | Choi et al. |
| 6,621,735 B2 | * | 9/2003 | Nakamura et al. ..... 365/185.17 |
| 6,661,707 B2 | | 12/2003 | Choi et al. |
| 7,061,802 B2 | | 6/2006 | Nakai |
| 7,212,447 B2 | | 5/2007 | Aritome |
| 7,233,522 B2 | | 6/2007 | Chen et al. |
| 7,274,603 B2 | * | 9/2007 | Futatsuyama et al. .. 365/189.11 |
| 7,315,472 B2 | | 1/2008 | Lee |
| 2004/0151033 A1 | | 8/2004 | Takazawa et al. |
| 2004/0213045 A1 | | 10/2004 | Nakai |
| 2005/0213378 A1 | | 9/2005 | Chang |

FOREIGN PATENT DOCUMENTS

| | | |
|---|---|---|
| JP | 11-086574 | 3/1999 |
| JP | 2002-150782 | 5/2002 |
| JP | 2002-358792 | 12/2002 |
| KR | 1020020047770 A | 6/2002 |
| KR | 1020020050367 A | 6/2002 |
| KR | 1020050002245 A | 1/2005 |

* cited by examiner

*Primary Examiner*—Hoai V Ho
(74) *Attorney, Agent, or Firm*—Volentine & Whitt, P.L.L.C.

(57) ABSTRACT

A non-volatile memory device includes a memory cell array and a voltage control unit. The memory cell array includes a plurality of memory blocks each including a plurality of cell strings. Each of the cell strings includes a first selection transistor, a second selection transistor, and at least one memory cell transistor serially connected between the first selection transistor and the second selection transistor. The voltage control unit provides first selection line voltages and word line voltages to first selection lines connected to the first selection transistors and word lines connected to the memory cell transistors, respectively, in response to a plurality of block selection signals corresponding to the plurality of memory blocks, and provides a second selection line voltage directly to second selection lines connected to the second selection transistors independently of the block selection signals

16 Claims, 3 Drawing Sheets

NON-VOLATILE MEMORY DEVICE AND PROGRAMMING, READING AND ERASING METHODS THEREOF

BACKGROUND OF THE INVENTION

1. Field of the Invention

The present invention relates to a non-volatile memory device, and more particularly, to a non-volatile memory device and programming, reading, and erasing methods thereof.

A claim of priority is made to Korean Patent Application No. 10-2006-0106716, filed Oct. 31, 2006, in the Korean Intellectual Property Office, the disclosure of which is incorporated herein by reference in its entirety.

2. Description of the Related Art

F-N tunneling is utilized to program and erase cell transistors contained in non-volatile memory devices, such as NAND type flash memory devices.

For example, F-N tunneling is induced in an erase operation by applying a low voltage (e.g., 0V or ground) to a control gate of a cell transistor, and by applying a high voltage (e.g., 20V) which exceeds a supply voltage to a semiconductor substrate (or bulk) containing the cell transistor. The resultant large voltage differential causes a strong electric field to be formed between the floating gate and the bulk, and F-N tunneling occurs in which electrons are discharged from the floating gate to the bulk. This causes the threshold voltage (Vth) of the erased cell transistor to shift in a negative direction (e.g., $Vth \leq -3V$). In conventional terms, the erased state is designated as data "1", and a cell transistor in this state is referred to as an "ON" cell.

In a program operation, for example, a high voltage (e.g., 18V) which exceeds a supply voltage is applied to the control gate of the cell transistor, and a low voltage (e.g., 0V or ground) is applied to the drain of the cell transistor and to the semiconductor bulk. When the cell transistor is biased in this manner, F-N tunneling results and electrons are injected to a floating gate of the cell transistor. This causes the threshold voltage (Vth) of the programmed cell transistor to shift in a positive direction (e.g., $Vth \geq +1V$). The programmed state is conventionally designated as data "0", and the cell transistor is referred to as an "OFF" cell.

FIG. 1 is a block diagram of a conventional NAND type flash memory device 100. The NAND type flash memory device 100 includes a memory cell array 110, a row selecting circuit 130, a row decoder circuit (not shown), a page buffer circuit 150 (or a data sensing and latching circuit), and a column decoder circuit 170.

The memory cell array 110 includes a plurality of memory blocks BLK0 through BLKn each having a plurality of cell strings (n is a positive integer). As illustrated in FIG. 1, each of the cell strings includes of a string selection transistor SST connected to a corresponding bit line, e.g., a bit line BL0, a ground selection transistor GST connected to a common source line CSL, and memory cell transistors MC15 through MC0 connected between the string selection transistor SST and the ground selection transistor GST. Each of the memory cell transistors MC15 through MC0 forms a memory cell. FIG. 1 illustrates the example of 16 memory cells per cell string, but the number of memory cells contained in each string may vary among different NAND flash memory devices.

As shown in FIG. 1, the string selection transistor SST, the memory cells MC15 through MC0, and the ground selection transistor GST are respectively gated to a string selection line SSL, word lines WL15 through WL0, and a ground selection line GSL. Further, as shown, block selection transistors BS17 through BS0 are respectively connected between the lines SSL, WL15 through WL0, and GSL, and lines SS, Si15 through Si0, and GS. The block selection transistors BS17 through BS0 are commonly controlled by a block selection signal BS.

The row selecting circuit 130 is responsive to the row decoder (not shown) to select a word line (or a page) from among the word lines WL0 through WL15 via block selection transistors BS0 through BS17. In a programming mode, the page buffer circuit 150 temporarily stores data to be stored in memory cells of the selected word line (or page). In a read mode, the page buffer circuit 150 senses data stored in the memory cells of the selected word line (or page). The page buffer circuit 150 includes a plurality of page buffers (or data sensing and latching blocks) which respectively correspond to rows (bit lines) related to the selected page. Data bits that are sensed (read) from the memory cells of the selected page are output via the column decoder circuit 170 in predetermined units, e.g., in units of bytes X8.

FIG. 2 is a circuit diagram of another flash memory device 200. This device is at least partially characterized in that wirings for providing voltages to the string selection lines SSL are metal-strapped to one another, as are the wirings for providing voltages to the ground selection lines GSL.

In a standby state prior to the read operation, both the string selection lines SSL and the ground selection lines GSL are discharged to ground voltage. When the read operation is performed, a supply voltage (e.g., VPP) is applied as a block selection signal to the selection transistors of a selected block, while a ground voltage (e.g., 0V) is applied as a block selection signal to the selection transistors of a non-selected block During the read operation, the voltages of the string selection line SSL and the ground selection line GSL of the selected block are increased from the ground voltage (0V) to a read voltage VREAD. Further, a ground voltage (0V) is applied to a selected word line WLm of the selected block, and the read voltage is VREAD is applied to the unselected word lines WL0~WLm−1 and WLm+1~WLn. In this state, data is read out from the cell transistor(s) of a selected bit line(s).

SUMMARY OF THE INVENTION

According to an aspect of the present invention, a non-volatile memory device is provided which includes a memory cell array and a voltage control unit. The memory cell array includes a plurality of memory blocks each including a plurality of cell strings. Each of the cell strings includes a first selection transistor, a second selection transistor, and at least one memory cell transistor serially connected between the first selection transistor and the second selection transistor. The voltage control unit provides first selection line voltages and word line voltages to first selection lines connected to the first selection transistors and word lines connected to the memory cell transistors, respectively, in response to a plurality of block selection signals corresponding to the plurality of memory blocks, and provides a second selection line voltage directly to second selection lines connected to the second selection transistors independently of the block selection signals.

According to another aspect of the present invention, a method of reading a non-volatile memory device is provided, where the non-volatile memory device includes a memory cell array including a plurality of memory blocks each including a plurality of cell strings, each of the cell strings including a first selection transistor, a second selection transistor, and at least one memory cell transistor serially connected between the first selection transistor and the second selection transistor. The method includes applying a read voltage to second selection lines that are connected to the second selection transistors and commonly connected to one another, in response to a read command and an address command, and performing a read operation on a block selected from among the plurality of memory blocks.

According to yet another aspect of the present invention, a method of programming a non-volatile memory device is provided, where the non-volatile memory device includes a memory cell array including a plurality of memory blocks each including a plurality of cell strings, each of the cell strings including a first selection transistor, a second selection transistor, and at least one memory cell transistor serially connected between the first selection transistor and the second selection transistor. The method includes applying a ground voltage to second selection lines that are connected to the second selection transistors and commonly connected to one another, in response to a programming command and an address command, and performing a programming operation on a block selected from among the plurality of memory blocks, in response to the programming command and the address command.

According to still another aspect of the present invention, a method of erasing a non-volatile memory device is provided, where the non-volatile memory device includes a memory cell array including a plurality of memory blocks each including a plurality of cell strings, each of the cell strings including a first selection transistor, a second selection transistor, and at least one memory cell transistor serially connected between the first selection transistor and the second selection transistor. The method includes applying an erasing voltage to second selection lines that are connected to the second selection transistors and commonly connected to one another, in response to an erasing command and an address command, and performing an erasing operation on a block selected from among the plurality of memory blocks, in response to the erasing command and the address command.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF EMBODIMENTS

The present invention will now be described more fully with reference to the accompanying drawings, in which exemplary embodiments of the invention are shown.

Figure 3:
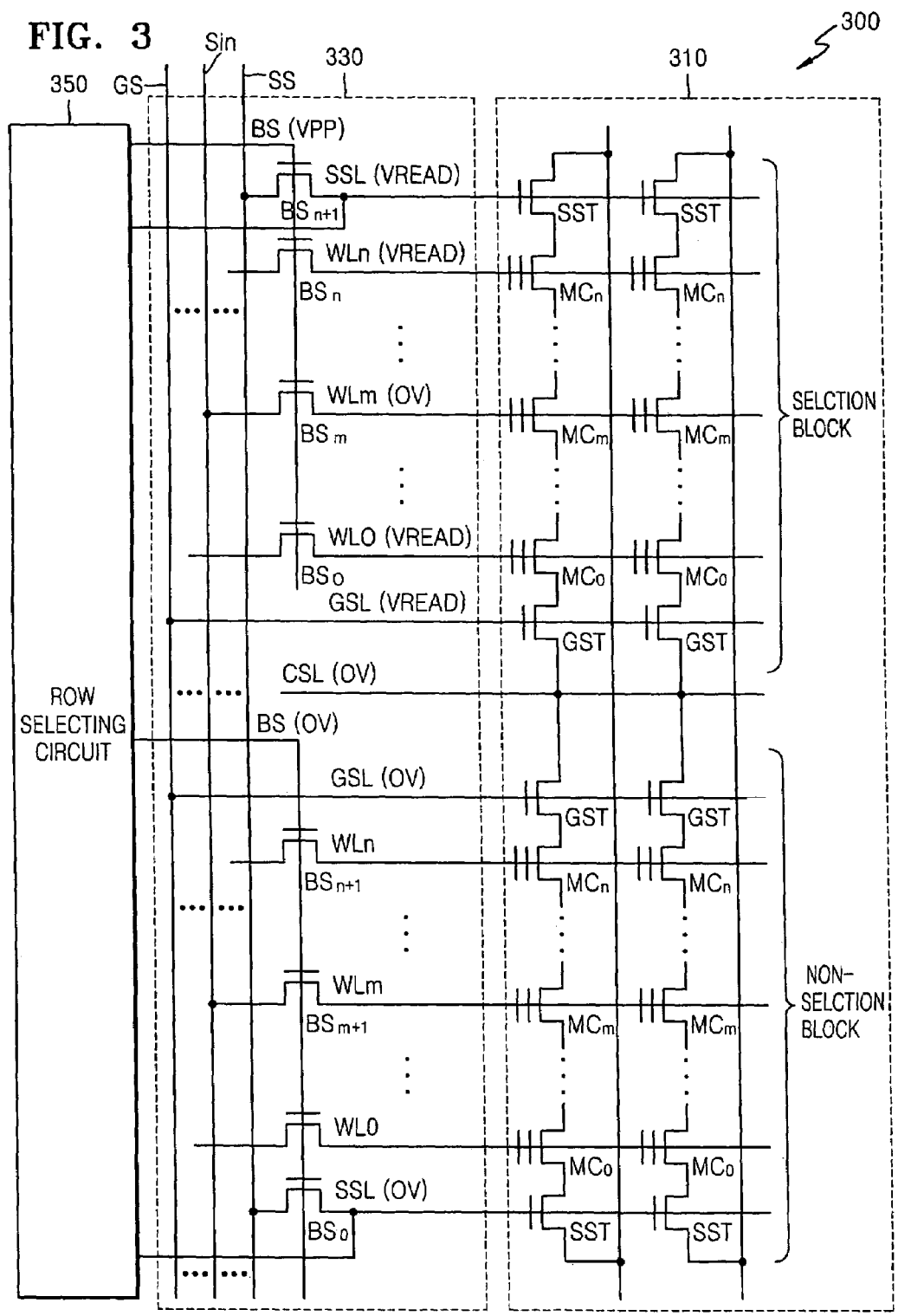
FIG. 3 is a block diagram of a non-volatile memory device according to an embodiment of the present invention.

FIG. 3 is a block diagram of a portion of a nonvolatile memory device 300 according to an embodiment of the present invention. In addition, FIG. 3 illustrates certain voltages during execution of a read operation of the nonvolatile memory device 300. As shown, the nonvolatile memory device 300 includes a memory cell array 310 and a voltage controller 330, and may further include a row selecting circuit 350.

The memory cell array 310 may include one or multiple memory blocks each including of a plurality of cell strings. By way of example only, and to simplify the drawing, FIG. 3 illustrates two memory blocks, and two cell strings within each memory block. The memory blocks of the memory cell array 310 are referred to herein as a selected block in which a memory cell is to be read, programmed or erased, and a non-selected block in which a memory cell is not to be read, programmed or erased.

Each of the cell strings includes a first selection transistor, a second selection transistor, and a plurality memory cell transistors MC0 through MCn connected in series between the first and second selection transistors. Herein, "n" is a positive integer. Each memory cell string is connected between a bit line of the memory cell array 310 and a column selection line CSL. As shown in the example of FIG. 3, a cell string of the selected memory block and a cell string of the non-selected memory block are connected to the same bit line.

In the example of FIG. 3, and in the description that follows, the first selection transistor is a string selection transistor SST that is gated to a string selection line SSL, and the second selection transistor is a ground selection transistor GST that is gated to a ground selection line GSL.

The voltage controller 330 includes block selection transistors BS0 through BSn+1 for each of the memory blocks of the memory cell array 310. The block selection transistors BS0 through BSn+1 are gated to respective block selection signals BS provided for each memory block. In operation (e.g., programming, read and erase operations), the block selection transistors BSn+1 are responsive to respective block selection signals BS to apply a string selection voltage SS to string selection lines SSL of the memory cell array 310, and the block selection transistors BS0 through BSn are responsive to the respective block selection signals to apply word line voltages Si0 through Sin to word lines WL0 through WLn of the memory cell array 310. For example, the block selection signal BS of the selected memory block may be a high voltage such as VPP, and the block selection signal BS of each non-selected memory block may be a low voltage such as ground (0V).

Figure 1:
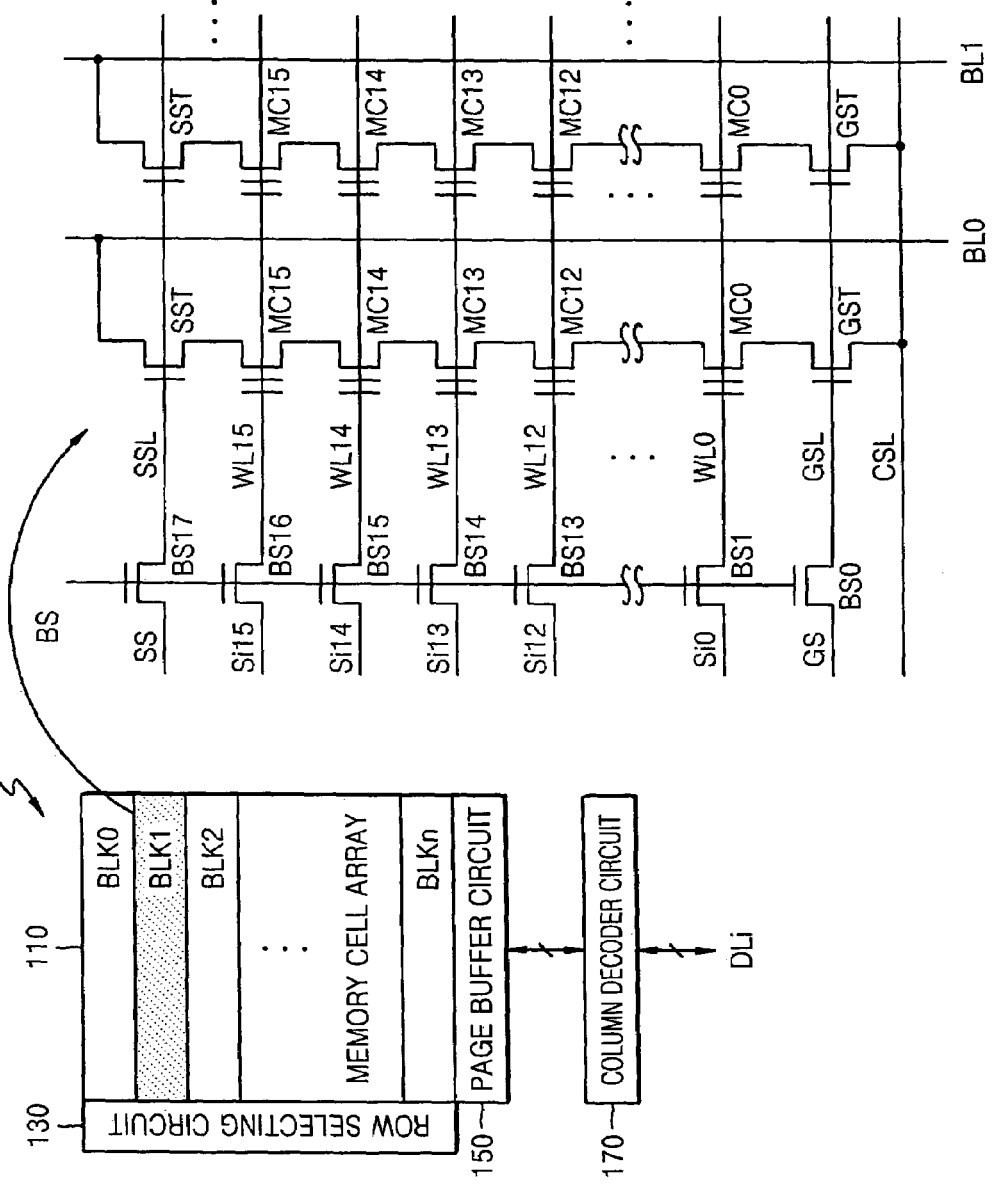
FIG. 1 is a diagram of a conventional NAND flash memory device.
Figure 2:
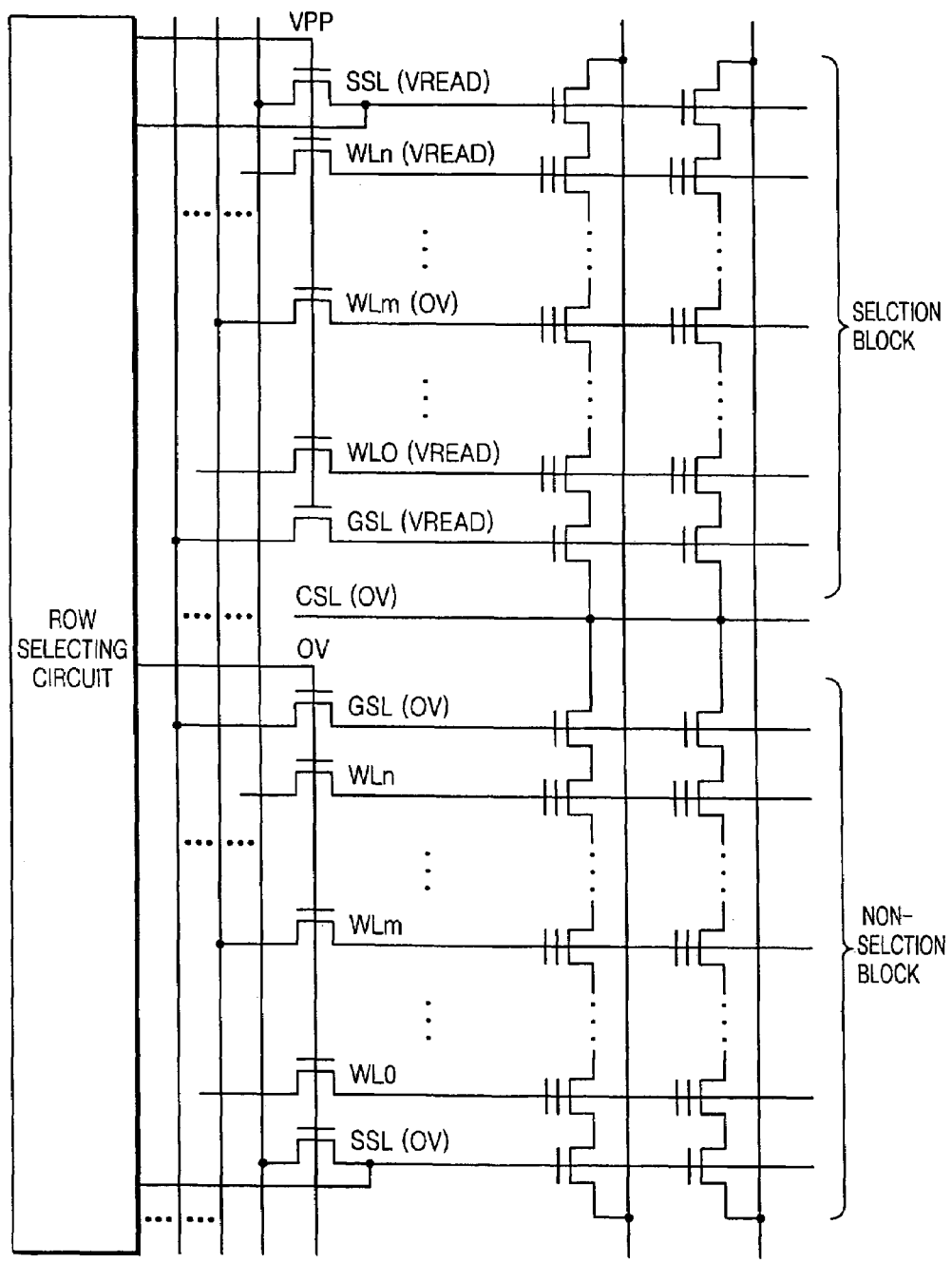
FIG. 2 is a diagram of another conventional flash memory device.

As shown in FIG. 3, and in contrast with FIG. 2, voltage controller 330 is not equipped with a block selection transistor for the ground selection line GSL of each memory block. In other words, the ground selection lines GSL of the memory blocks are directly applied with a ground selection voltage GS independently of the logic state of the respective block selection signals BS. This aspect of the embodiment will be described in greater detail later herein.

The nonvolatile memory device 300 may further include a row selecting circuit 350 which is utilized, for example, to apply the block selections signals BS and to pre-charge the string selection lines SSL. For example, the row selecting circuit 350 may output the respective block signals BS in response to an address command that is input when a predetermined operation is executed.

In FIG. 3, the row selecting circuit 350 and the voltage controller 330 are illustrated as separate circuit blocks. However, this is for descriptive purposes only. It should be apparent to those of ordinary skill in the technical field to which the present embodiment pertains that the row selecting circuit 350 and the voltage controller 330 may be integrated into a single circuit block, such as a row decoder block.

The present embodiment is partially characterized by the second selection line voltage (e.g., the ground selection voltage GS) being applied directly to the second selection lines (e.g., the ground selection lines GSL). For example, the common voltage line carrying the ground selection voltage GS for the plural memory blocks of the memory array 310 is directly electrically connected to the ground selection lines GSL of the plural memory blocks. In other words, a block selection transistor BS is not interposed between the common voltage line carrying the ground selection voltage GS and the ground selection lines GSL. Accordingly, the voltage control unit 330 can control all of the second selection lines GSL at the same time, i.e., it is not necessary to individually control the second selection lines GSL for each block. Thus, control of the second selection lines GSL is facilitated.

Further, when compared with the non-volatile memory device 200 of FIG. 2, the second selection lines GSL of the non-volatile memory device 300 do not need to be metal strapped for each memory block, and the transistors GST for controlling the second selection lines GSL are not necessary. Hence, the size of a non-volatile memory device may be reduced when compared with a conventional non-volatile memory device, and thus allowing for a reduction in chip size.

It is noted that when a read voltage VREAD is applied to the ground selection lines GSL of non-selected block, the string selections lines SSL of the non-selected blocks is a low voltage (e.g., 0V). Therefore, the strings of the non-selected memory blocks remain electrically disconnected from the bit lines, even though the ground selection lines GSL of the non-selected memory blocks are in a high state (VREAD).

It is further noted that, in a programming or erasing operation, an identical voltage (i.e., a ground voltage or an erasing voltage) is applied to the first selection lines SSL and the second selection lines GSL of the non-selected blocks. Hence, efficiency is enhanced by commonly connecting the second selection lines GSL to one another as in the present embodiment.

An operation of the non-volatile memory device 300 according to an embodiment of the present invention will now be described briefly.

First, during reading, the read voltage VREAD is applied to the ground selection lines GSL in response to a read command and an address command. Since the ground selection lines GSL are commonly connected to one another in the present embodiment, the read voltage VREAD can be applied to the second selection lines GSL at the same time. Thereafter, a reading operation is conducted on a memory block selected from among a plurality of memory blocks in response to the read command and the address command.

More specifically, the row selection circuit 350 outputs the block selection signals BS for selecting a memory block to undergo a reading operation from among a plurality of memory blocks in response to an address command. The voltage control unit 330 applies voltage signals with predetermined levels to the first selection lines SSL and the word lines WL0 through WLn so that the reading operation is conducted. In other words, as shown in the example of FIG. 3, the voltage control unit 330 applies the read voltage VREAD to the string selection lines SSL and to unselected word lines WL0~WLm−1 and WLm+1~WLn of the selected memory block, and a ground voltage 0V to the selected word line WLm of the selected memory block. Under these bias conditions, reading is performed.

During programming, a ground voltage 0V is applied to the ground selection lines GSL in response to a programming command and an address command. Since the ground selection lines GSL are commonly connected to one another in the present embodiment, the ground voltage 0V can be applied to the second selection lines GSL at the same time. Thereafter, a programming operation is conducted on a memory block selected from among a plurality of memory blocks in response to the programming command and the address command.

More specifically, the row selection circuit 350 outputs the block selection signals BS for selecting a memory block to undergo a programming operation from among a plurality of memory blocks in response to an address command. The voltage control unit 330 applies voltage signals with predetermined levels to the first selection lines SSL and the word lines WL0 through WLn so that the programming operation is conducted. In other words, the voltage control unit 330 applies the ground voltage 0V to the string selection lines SSL of the selected memory block, a pass voltage to unselected word lines of the selected memory block, and a programming voltage to selected word lines of the selected memory block. Under these bias conditions, programming is performed.

During erasing, an erasing voltage of 0V is applied to the ground selection lines GSL in response to an erasing command and an address command. Since the ground selection lines GSL are commonly connected to one another in the present embodiment, the erasing voltage of 0V can be applied to the second selection lines GSL at the same time. Thereafter, an erasing operation is conducted on a memory block selected from among a plurality of memory blocks in response to the erasing command and the address command.

More specifically, the row selection circuit 350 outputs the block selection signals BS for selecting a memory block to undergo an erasing operation from among a plurality of memory blocks in response to an address command. The voltage control unit 330 applies voltage signals with predetermined levels to the string selection lines SSL and the word lines WL0 through WLn so that the erasing operation is conducted. In other words, the voltage control unit 330 applies the erasing voltage of 0V to the string selection lines SSL and unselected word lines of the selected memory block, and a ground voltage (0V) to selected word lines of the selected memory block. Under these bias conditions, erasing is performed.

As described above, a non-volatile memory device according to the present invention utilizes ground selection lines that are commonly connected to one another. As such, as described above, the size of the non-volatile memory device may be reduced when compared with conventional non-volatile memory devices. In addition, the ground selection lines can be more easily controlled.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory device comprising:
a memory cell array comprising a plurality of memory blocks each comprising a plurality of cell strings, each of the cell strings comprising a first selection transistor, a second selection transistor, and at least one memory cell transistor serially connected between the first selection transistor and the second selection transistor; and
a voltage control unit which provides first selection line voltages and word line voltages to first selection lines connected to the first selection transistors and word lines connected to the memory cell transistors, respectively, in response to a plurality of block selection signals corresponding to the plurality of memory blocks, and which provides a second selection line voltage directly to second selection lines connected to the second selection transistors independently of the block selection signals.

2. The non-volatile memory device of claim 1, wherein the second selection lines are commonly connected to one another.

3. The non-volatile memory device of claim 1, further comprising a row selecting circuit which provides the block selection signals to the voltage control unit, wherein the block selection signals each select a respective memory block from among the plurality of memory blocks to be subjected to a predetermined operation.

4. The non-volatile memory device of claim 3, wherein a voltage level of a block selection signal corresponding to a selected block is a first selection voltage level, and a voltage level of a block selection signal corresponding to a remaining non-selected memory block is a second selection voltage level.

5. The non-volatile memory device of claim 1, wherein the first selection lines are string selection lines, and the second selection lines are ground selection lines.

6. A non-volatile memory device comprising:
a memory block in a memory cell array, the memory block including at least one cell string comprising a first selection transistor, a second selection transistor, and at least one memory cell transistor serially connected between the first selection transistor and the second selection transistor; and
a voltage controller configured to provide a first selection line voltage to a first selection line connected to the first selection transistor, and a word line voltage to at least one word line respectively connected to the at least one memory cell transistor, in response to a block selection signal corresponding to the memory block, and to provide a second selection line voltage directly to a second selection line connected to the second selection transistor, independently of the block selection signals.

7. The method of claim 6, wherein the first selection lines are string selection lines, and the second selection lines are ground selection lines.

8. The non-volatile memory device of claim 6, wherein when the memory block is a selected memory block, the block selection signal comprises a high voltage.

9. The non-volatile memory device of claim 8, wherein the high voltage is VPP.

10. The non-volatile memory device of claim 6, wherein when the memory block is a non-selected memory block, the block selection signal comprises a low voltage.

11. The non-volatile memory device of claim 10, wherein the low voltage is a ground voltage.

12. The non-volatile memory device of claim 6, further comprising:
a row selector configured to provide the block selection signal to the voltage controller.

13. A non-volatile memory device comprising:
a first memory block in a memory cell array, the first memory block including at least one cell string comprising a string selection transistor gated to a string selection line, a ground selection transistor gated to a ground selection line, and a plurality of memory cell transistors gated to a corresponding plurality word lines and serially connected between the string selection transistor and the ground selection transistor; and
a voltage controller comprising a first block selection transistor gated to a block selection signal for selectively connecting a string selection voltage to the string selection line, and a plurality of second block selection transistors gated to the block selection signal for selectively connecting a plurality of word line voltages to the plurality of word lines,
wherein the voltage controller provides a ground selection voltage directly to the ground selection line, without a block selection transistor being between the ground selection voltage and the ground selection line.

14. The non-volatile memory device of claim 13, further comprising:
a second memory block in the memory cell array, the second memory block including at least one cell string comprising a ground selection transistor gated to a ground selection line,
wherein the voltage controller further comprises a common voltage line for connecting the ground selection voltage directly to both the ground selection line of the first memory block and the ground of the second memory block.

15. The non-volatile memory device of claim 13, wherein the voltage controller provides the ground selection voltage to the ground selection line independently of a logic state of the block selection signal.

16. The non-volatile memory device of claim 13, further comprising:
a row selector configured to provide the block selection signal to the voltage controller.

* * * * *